(12) United States Patent
Yeh et al.

(10) Patent No.: US 12,424,454 B2
(45) Date of Patent: *Sep. 23, 2025

(54) COMPOSITE LAYER CIRCUIT ELEMENT

(71) Applicant: Innolux Corporation, Miao-Li County (TW)

(72) Inventors: Chuan-Ming Yeh, Miao-Li County (TW); Heng-Shen Yeh, Miao-Li County (TW); Kuo-Jung Fan, Miao-Li County (TW); Cheng-Chi Wang, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 56 days.

This patent is subject to a terminal disclaimer.

(21) Appl. No.: 18/366,576

(22) Filed: Aug. 7, 2023

(65) Prior Publication Data
US 2023/0377904 A1 Nov. 23, 2023

Related U.S. Application Data

(62) Division of application No. 17/524,713, filed on Nov. 11, 2021, now Pat. No. 11,764,077.

(30) Foreign Application Priority Data

Jul. 23, 2021 (CN) .......................... 202110835017.9
Oct. 19, 2021 (CN) .......................... 202111217666.9

(51) Int. Cl.
*H01L 21/48* (2006.01)
*H01L 23/00* (2006.01)
*H01L 23/498* (2006.01)
*H05K 1/02* (2006.01)
*H05K 3/00* (2006.01)
*H05K 3/46* (2006.01)

(52) U.S. Cl.
CPC .... *H01L 21/4857* (2013.01); *H01L 23/49822* (2013.01); *H01L 23/562* (2013.01); *H05K 1/0271* (2013.01); *H05K 3/007* (2013.01); *H05K 3/4647* (2013.01); *H05K 2201/068* (2013.01)

(58) Field of Classification Search
CPC ........... H01L 21/4857; H01L 23/49822; H01L 2221/68345; H01L 21/6835; H05K 3/007; H05K 3/4647; H05K 2201/068
See application file for complete search history.

(56) References Cited

U.S. PATENT DOCUMENTS 9,137,903 B2 * 9/2015 Kang ................... H01L 23/562
2004/0012938 A1 * 1/2004 Sylvester ............ H01L 21/4857
257/E23.079
2004/0257749 A1 * 12/2004 Otsuka .................. H05K 1/162
257/E23.079

(Continued)

*Primary Examiner* — Jeffrey T Carley
*Assistant Examiner* — Jose K Abraham
(74) *Attorney, Agent, or Firm* — JCIPRNET

(57) ABSTRACT

The embodiment of the disclosure provides a composite layer circuit element of an electronic device. The composite layer circuit element includes a first dielectric layer, a first circuit layer and a second dielectric layer. The first circuit layer is disposed on the first dielectric layer, and the second dielectric layer is disposed on the first circuit layer. A thickness of the first dielectric layer is greater than a thickness of the second dielectric layer in a cross section view.

1 Claim, 9 Drawing Sheets

(56) References Cited

U.S. PATENT DOCUMENTS

| | | | | |
|---|---|---|---|---|
| 2006/0193970 A1* | 8/2006 | Myung | .................. | C23C 28/023 |
| | | | | 427/96.1 |
| 2007/0125575 A1* | 6/2007 | Inui | .................... | H01L 23/49822 |
| | | | | 257/E23.079 |
| 2009/0046441 A1* | 2/2009 | Funaya | ............. | H01L 23/49811 |
| | | | | 361/783 |
| 2012/0155055 A1* | 6/2012 | Kang | ................ | H01L 23/49811 |
| | | | | 29/830 |
| 2013/0013148 A1* | 1/2013 | Park | ........................ | H04W 4/00 |
| | | | | 701/1 |
| 2013/0271681 A1* | 10/2013 | Chen | ................. | G02F 1/136213 |
| | | | | 349/38 |
| 2014/0041919 A1* | 2/2014 | Huang | ................. | H05K 1/0221 |
| | | | | 29/846 |
| 2014/0252647 A1* | 9/2014 | Huang | ................... | H01L 24/11 |
| | | | | 257/774 |
| 2015/0118391 A1* | 4/2015 | Kilhenny | ............... | H05K 1/053 |
| | | | | 362/373 |
| 2015/0309378 A1* | 10/2015 | Chen | ................. | G02F 1/134363 |
| | | | | 257/773 |
| 2017/0103941 A1* | 4/2017 | Zhou | ................ | H01L 21/76879 |
| 2017/0164458 A1* | 6/2017 | Vrtis | .................... | H05K 1/0271 |
| 2018/0138114 A1* | 5/2018 | Lee | .................. | H01L 23/49822 |
| 2018/0352648 A1* | 12/2018 | Kitamura | ............. | H01L 23/053 |
| 2019/0131262 A1* | 5/2019 | Yu | ........................ | H01L 21/563 |
| 2019/0341342 A1* | 11/2019 | Raorane | ............. | H01L 21/4857 |
| 2019/0348385 A1* | 11/2019 | Lu | ........................ | H01L 21/486 |
| 2020/0137895 A1* | 4/2020 | Wu | ........................ | H05K 1/118 |
| 2020/0203302 A1* | 6/2020 | Chew | ........................ | H01L 24/73 |
| 2021/0391317 A1* | 12/2021 | Wu | ........................ | H01L 24/20 |

* cited by examiner

COMPOSITE LAYER CIRCUIT ELEMENT

CROSS-REFERENCE TO RELATED APPLICATION

This application is a divisional application of and claims the priority benefit of a prior application Ser. No. 17/524,713, filed on Nov. 11, 2021. The prior application Ser. No. 17/524,713 claims the priority benefit of China application serial no. 202110835017.9, filed on Jul. 23, 2021, and China application serial no. 202111217666.9, filed on Oct. 19, 2021. The entirety of each of the above-mentioned patent applications is hereby incorporated by reference herein and made a part of this specification.

BACKGROUND

Technical Field

The embodiments of the disclosure relate to an electronic device including a circuit element, and in particular to a composite layer circuit element and a manufacturing method thereof.

Description of Related Art

As there are more and more applications of electronic devices, the process yield of electronic devices has become a focus in the field. In an existing manufacturing method of an composite layer circuit element, due to a difference between the coefficient of thermal expansion of a substrate and the coefficient of thermal expansion of layers in the composite layer circuit element, the composite layer circuit element is prone to warp in the manufacturing process, affecting the structure or quality of the electronic device. Based on the above, a manufacturing method of an electronic device that addresses the above-mentioned issue is needed.

SUMMARY

According to the embodiment of the disclosure, a manufacturing method of an electronic device including a composite layer circuit element includes the following. A carrier is provided. A first dielectric layer is formed on the carrier. The first dielectric layer is patterned. The carrier on which the first dielectric layer is formed is disposed on a first curved-surface mold and the first dielectric layer is cured. A second dielectric layer is formed on the first dielectric layer. The second dielectric layer is patterned. The carrier on which the first dielectric layer and the second dielectric layer are formed is disposed on a second curved-surface mold and the second dielectric layer is cured. A thickness of a projection of the first curved-surface mold is smaller than a thickness of a projection of the second curved-surface mold.

According to the embodiment of the disclosure, a composite layer circuit element of an electronic device includes a first dielectric layer, a first circuit layer and a second dielectric layer. The first circuit layer is disposed on the first dielectric layer, and the second dielectric layer is disposed on the first circuit layer. A thickness of the first dielectric layer is greater than a thickness of the second dielectric layer.

DESCRIPTION OF THE EMBODIMENTS

Figure 1:
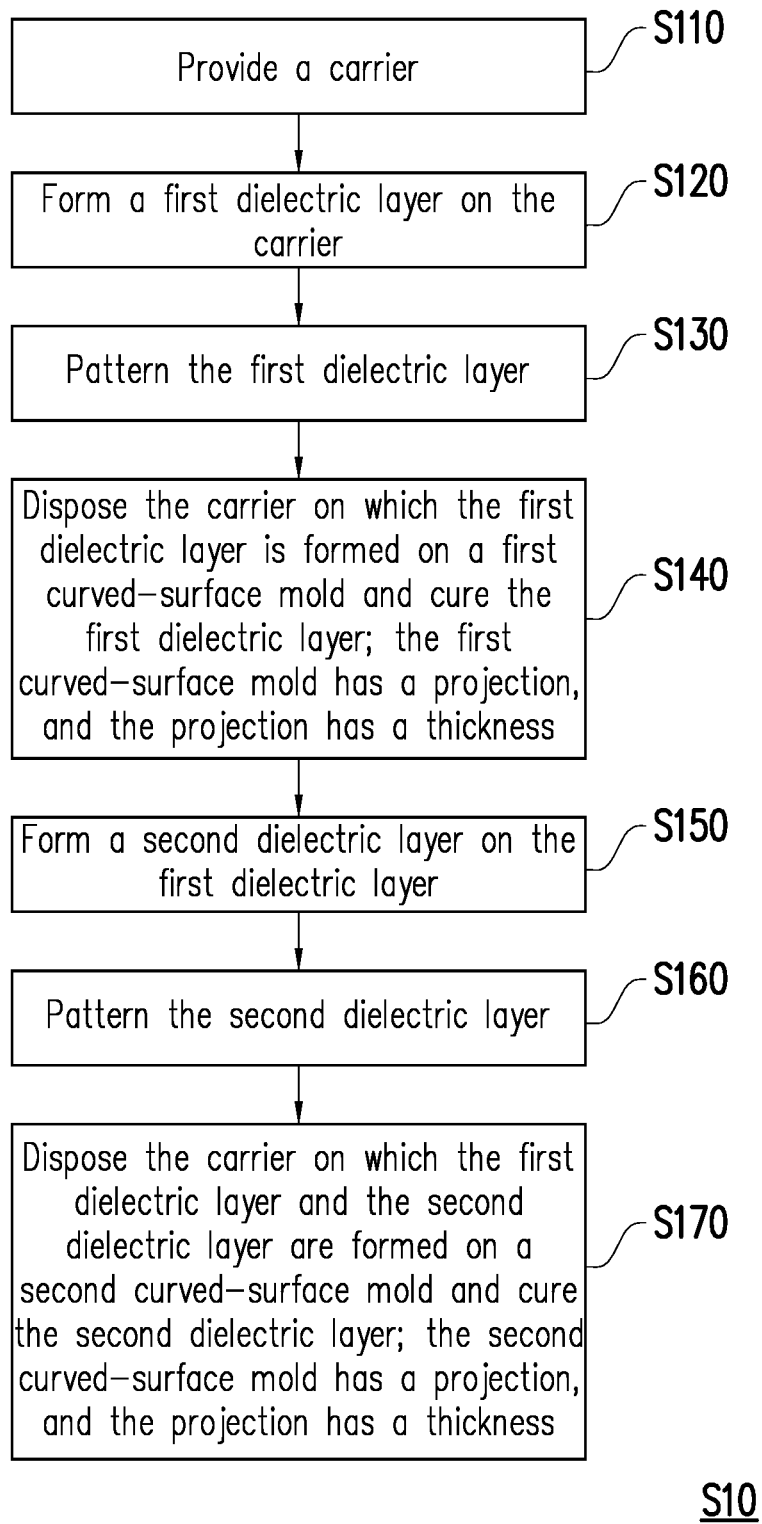
FIG. 1 is a flow chart of a manufacturing method of a composite layer circuit element according to an embodiment of the disclosure.

The disclosure may be understood by referring to the following detailed description in conjunction with the accompanying drawings. It should be noted that, in order to make it easy for readers to understand and to simplify the drawings, only part of the electronic device is drawn in the multiple drawings in the disclosure. The specific elements in the drawings are not drawn according to the actual scale. In addition, the number and size of each element in the drawings are for illustration only, and are not used to limit the scope of the disclosure.

Certain words are used throughout the specification of the disclosure and the appended claims to refer to specific elements. Those skilled in the art should understand that electronic appliance manufacturers may refer to a same component by different names. This document does not intend to distinguish between components that have the same function but different names. In the following description and claims, words such as "include", "contain", and "have" are open-ended words, so they should be interpreted as meaning "including but not limited to . . . ". Therefore, when the terms "include", "contain" and/or "have" are used in the description of the disclosure, they specify the existence of corresponding features, regions, steps, operations and/or components, but do not exclude the existence of one or more corresponding features, regions, steps, operations and/or components.

The terms of direction mentioned in this document, for example: "upper", "lower", "front", "rear", "left", "right", etc., are only directions with reference to the drawings. Therefore, the direction terms are used to illustrate, not to limit the disclosure. In the drawings, each drawing shows the general features of the method, structure, and/or material used in a specific embodiment. However, these drawings should not be construed as defining or limiting the scope or nature of these embodiments. For example, for the sake of clarity, the relative size, thickness, and position of each layer, region, and/or structure may be reduced or enlarged.

It should be understood that when an element or film layer is said to be "connected" to another element or film layer, it may be directly connected to said another element or film layer, or there is an element or film layer inserted between the two. When an element is said to be "directly connected" to another element or film, there is no element or film inserted between the two. In addition, when a component is said to be "coupled to another component (or a variant thereof)", it may be directly connected or electrically connected to said another component, or indirectly connected or electrically connected through one or more components to said another component.

In the disclosure, the length and width may be measured by an optical microscope, and the thickness may be measured by a cross-sectional image in an electron microscope, but the disclosure is not limited thereto. In addition, there may be a certain error in any two values or directions used for comparison.

The terms "approximately", "equal to", "equal" or "same", "substantially" or "roughly" are generally interpreted as being within 20% of a given value or range, or interpreted as being within 10%, 5%, 3%, 2%, 1% or 0.5% of the given value or range.

The term "between value A and value B" is interpreted as the condition of including value A and value B or at least one of value A and value B, and including other values between value A and value B.

A structure (or layer type, component, substrate) described in the disclosure as being located on another structure (or layer type, element, substrate) may refer to the two structures being adjacent and directly connected to each other, or the two structures being adjacent and not directly connected to each other. An indirect connection means that there is at least one intermediary structure (or intermediary layer, intermediary component, intermediary substrate, and intermediary interval) between two structures. The lower surface of one structure is adjacent or directly connected to the upper surface of the intermediate structure, and the upper surface of the other structure is adjacent or directly connected to the lower surface of the intermediate structure, and the intermediary structure may be a monolayer or multi-layer physical structure or non-physical structure, and the disclosure is not limited thereto. In the disclosure, when a structure is "on" another structure, it may mean that the structure is "directly" on said another structure, or that the structure is "indirectly" on said another structure, that is, there is at least one structure between the structure and said another structures.

"First", "second" . . . etc. in the specification of the disclosure may be used in this document to describe various elements, components, regions, layers, and/or parts, but these elements, components, regions, and/or parts shall not be limited by these terms. These terms are only used to distinguish one element, component, region, layer, or part from another element, component, region, layer, or part. Therefore, the "first element", "component", "region", "layer", or "part" discussed below are used to distinguish from the "second element", "component", "region", "layer", or "part", and are not used to limit the order or limit the disclosure to specific elements, components, regions, layers and/or parts.

The electronic device may achieve good electronic effects through the composite layer circuit element of the embodiment of the disclosure. The electronic device may include a display device, a package device, a backlight device, an antenna device, a sensing device, or a splicing device, but the disclosure is not limited thereto. The electronic device may be a bendable or flexible electronic device. The display device may be a non-self-luminous type display device or a self-luminous type display device. The antenna device may be a liquid crystal type antenna device or a non-liquid crystal type antenna device, and the sensing device may be a sensing device that senses capacitance, light, heat, or ultrasound, but the disclosure is not limited thereto. Electronic components may include passive components and active components, such as capacitors, resistors, inductors, diodes, and transistors. The diode may include a light emitting diode or a photodiode. The light emitting diode may include, for example, an organic light emitting diode (OLED), a mini-light-emitting diode (mini LED), a micro-light-emitting diode (micro LED) or a quantum dot light-emitting diode (quantum dot LED), but the disclosure is not limited thereto. The splicing device may be, for example, a display splicing device or an antenna splicing device, but the disclosure is not limited thereto. It should be noted that the electronic device may be any combination of the foregoing, but the disclosure is not limited thereto. The content of the disclosure will be described with the composite layer circuit element as the electronic device or the splicing device as follows, but the disclosure is not limited thereto.

In the disclosure, various embodiments described below may be combined and matched without departing from the spirit and scope of the disclosure. For example, part of the features of one embodiment may be combined with part of the features of another embodiment to form yet another embodiment.

Now, reference will be made to the exemplary embodiment of the disclosure Specifically, and examples of the exemplary embodiment are illustrated in the accompanying drawings. Whenever possible, the same element symbols are used in the drawings and descriptions to indicate the same or similar parts.

Figure 2A:
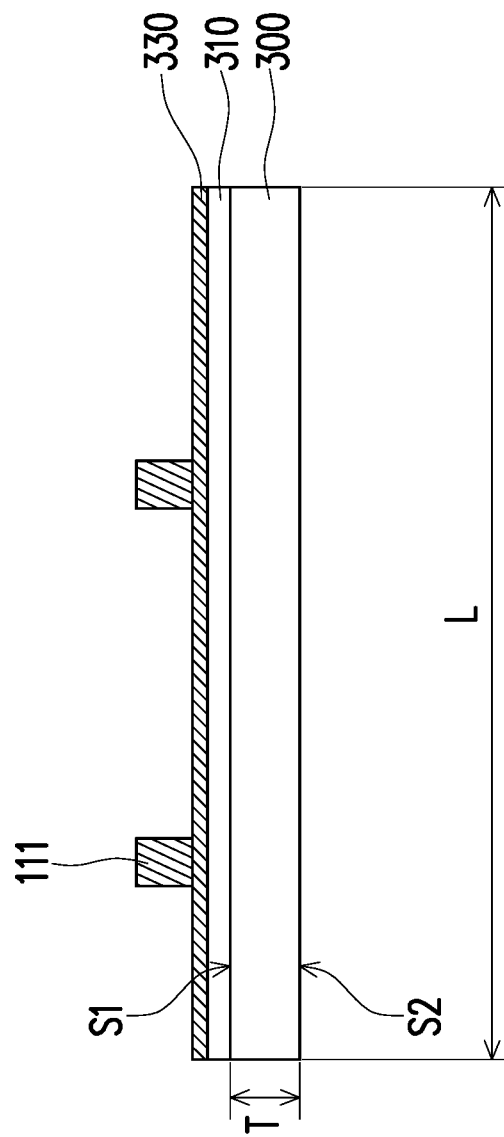
FIGS. 2A to 2G are schematic cross-sectional views of a manufacturing process of a composite layer circuit element according to an embodiment of the disclosure.

FIG. 1 is a flow chart of a manufacturing method of a composite layer circuit element according to an embodiment of the disclosure. FIGS. 2A to 2G are schematic cross-sectional views of a manufacturing process of a composite layer circuit element according to an embodiment of the disclosure. For the clarity of the drawings and the convenience of description, several components are omitted in FIGS. 2A to 2G. Referring to FIG. 1, in an embodiment of the disclosure, the manufacturing method S10 of a composite layer circuit element 100 includes the following steps. First, in step S110, a carrier 300 is provided. Next, in step S120, a first dielectric layer 110 is formed on the carrier 300. In step S130, the first dielectric layer 110 is patterned. In step S140, the carrier on which the first dielectric layer 110 is formed is disposed on a first curved-surface mold 200 and the first dielectric layer 110 is cured. The first curved-surface mold 200 has a projection 210, and the projection 210 has a thickness H1. In step S150, a second dielectric layer 120 is formed on the first dielectric layer 110. In step S160, the second dielectric layer 120 is patterned. In step S170, the carrier 300 on which the first dielectric layer 110 and the second dielectric layer 120 are formed is disposed on a second curved-surface mold 200A and the second dielectric layer 120 is cured. The second curved-surface mold 200A has a projection 210A, and the projection 210A has a thickness H2. In the step of curing the first dielectric layer 110 or the second dielectric layer 120, the first dielectric layer 110 or the second dielectric layer 120 is cured by, for example, a heating process to harden the configuration, which will be described in detail later. Since the coefficient of thermal expansion of the carrier 300 is different from the coefficient of thermal expansion of the dielectric layers, in the steps of curing the first dielectric layer 110 or the second dielectric layer 120, the carrier 300 has, for example, a warping force that pushes the carrier 300 to warp towards the direction of the first dielectric layer 110 or the second dielectric layer 120. For example, the carrier may have an inner surface 51 and an exterior surface S2. The inner surface 51 is closer to the first dielectric layer 110 or the second dielectric layer 120 than the exterior surface S2. "The carrier 300, for example, warps towards the direction of the first dielectric layer 110 or the second dielectric layer 120" as described above means that the inner surface 51 is compressed due to the warpage, so that the area of the plane (as shown in FIG. 2A) formed by the projection of the inner surface 51 to the X and Y axes is smaller than the area of the plane (as shown in FIG. 2A) formed by the projection of the exterior surface S2 to the X and Y axes, and the top view direction (for example, the Z axis in FIG. 2A) is perpendicular to the X axis and the Y axis, respectively.

In an embodiment of the disclosure, by providing the first curved-surface mold 200 or the second curved-surface mold 200A in the step of curing the first dielectric layer 110 and/or the second dielectric layer 120, the projection 210 of the first curved-surface mold 200 or the projection 210A of the second curved-surface mold 200A may form a bending force on the carrier 300. The bending force, for example, may push the carrier 300 to bend along the shape of the first curved-surface mold 200 or the second curved-surface mold 200A (the details of forming the bending force will be described later), and the direction of the bending force is, for example, roughly opposite to the direction of the warping force of the carrier 300 as described above, thereby reducing warpage.

The manufacturing method of the composite layer circuit element 100 will be briefly described below with the manufacturing process shown in FIGS. 2A to 2G. Through the method of manufacturing the composite layer circuit element 100 of the disclosure, the composite layer circuit element 100 may have good structural resistance or quality.

Referring to FIG. 2A, first, in step S110, the carrier 300 is provided. In some embodiments, the material of the carrier 300 may include organic or inorganic materials, such as glass, quartz, sapphire, ceramic, stainless steel, silicon wafer, molding compound (such as resin, epoxy resin, organic silicon compound), other suitable substrate materials, or a combination of the aforementioned, but is not limited thereto. In some embodiments, a thickness T of the carrier 300 may be between 0.5 millimeters (mm) and 1.5 mm (0.5 mm≤thickness T 1.5 mm) or between 0.7 mm and 1.3 mm (0.7 mm≤thickness T≤1.3 mm), but is not limited thereto. The thickness T may be defined as the average thickness of any three regions of the carrier 300 measured in the normal direction of the carrier 300. In some embodiments, when the carrier 300 is roughly rectangular, a length L of a side of the carrier 300 may be, for example, between 600 mm and 800 mm (600 mm≤length L≤800 mm) or between 650 mm and 750 mm. (650 mm≤length L≤750 mm), but is not limited thereto. For example, when the carrier 300 is roughly square, the length L may be defined as the length of a side of the carrier 300, and when the carrier 300 has other shapes, for example, a smallest rectangle may be defined to enclose the carrier 300, and the length L may be, for example, the length of the long side of the smallest rectangle. In some embodiments, the coefficient of thermal expansion (CTE) of the carrier 300 is between 2 ppm/° C. and 10 ppm/° C. (2 ppm/° C.≤coefficient of thermal expansion≤10 ppm/° C.) or between 4 ppm/° C. to 8 ppm/° C. (4 ppm/° C.≤coefficient of thermal expansion≤8 ppm/° C.), but is not limited thereto.

In some embodiments, a release layer 310 may be selectively disposed on the carrier 300.

Next, a first seed layer 330 may be successively disposed on the release layer 310. The release layer 310 may be removed in a subsequent step. In some embodiments, the release layer 310 may be an epoxy resin heat release material that loses its sticking characteristic when heated, such as a light-to-heat-conversion (LTHC) release coating, but is not limited thereto. In other embodiments, the release layer 310 may include an ultraviolet (UV) binder, and the release layer 310 may be an ultraviolet adhesive that loses its sticking characteristic when exposed to ultraviolet (UV), but is not limited thereto.

In some embodiments, the formation method of the first seed layer 330 includes physical vapor deposition, chemical vapor deposition, or electroplating. The material of the first seed layer 330 includes titanium, copper or other suitable materials, but is not limited thereto. In some embodiments, the first seed layer 330 includes a monolayer or a composite layer that includes a plurality of sublayers formed by different materials. In some embodiments, the first seed layer 330 may include a titanium layer and a copper layer on the titanium layer, but the disclosure is not limited thereto.

Next, a conductive material layer (not shown) is formed on the first seed layer 330. The conductive material layer may be formed by, for example, electroplating or other suitable methods. Next, the conductive material layer is patterned. Specifically, a patterned photoresist is formed on the conductive material layer to form a mask. Next, etching is performed on the conductive material exposed by the mask to form a plurality of conductive structures 111 on the first seed layer 330. It should be noted here that FIG. 2A only schematically shows two conductive structures 111, but the embodiment of the disclosure does not limit the number and/or shape of the conductive structures 111 thereto. According to design requirements, the number of conductive structures 111 may be less than or more than two.

In some embodiments, the material of the conductive material layer (or the conductive structure 111) includes, for example, metal or metal alloy. For example, the material of the conductive material layer (or the conductive structure 111) may include copper, titanium, tungsten, aluminum, other suitable materials or a combination thereof, but is not limited thereto. In some embodiments, the conductive structure 111 may be formed by stacking monolayer conductive materials or multi-layer conductive materials. In some embodiments, the thickness of the conductive structure 111 is approximately between 3 micrometers (μm) to 20 μm (3 μm≤thickness≤20 μm) or between 4 μm to 18 μm (4 μm≤thickness≤18 μm), but is not limited thereto.

Figure 2B:
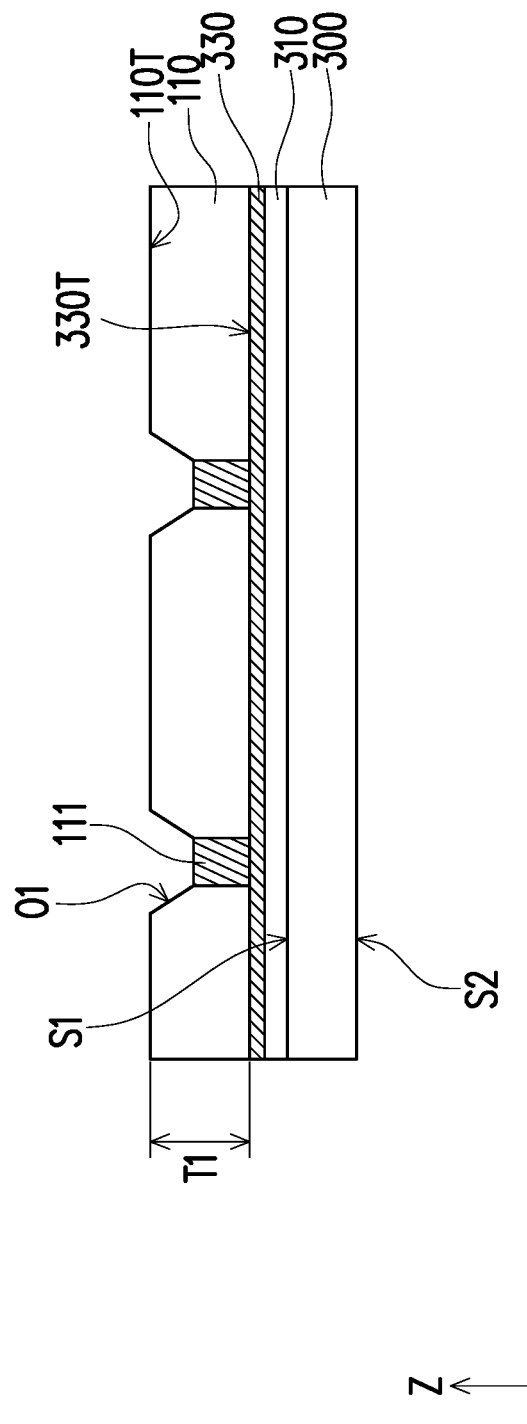

Referring to FIGS. 1 and 2B, in step S120, the first dielectric layer 110 is formed on the carrier 300, and in step S130, the first dielectric layer 110 is patterned. The cross-sectional structure after step S130 is shown in FIG. 2B. Specifically, the first dielectric layer 110 may be disposed on the first seed layer 330 and cover the conductive structure 111, and then the first dielectric layer 110 may be patterned subsequently. The step of patterning the first dielectric layer 110 includes "part of the first dielectric layer 110 corresponding to the conductive structure 111 is removed to expose the surface of the conductive structure 111", as shown in FIG. 2B. Specifically, the method of patterning the first dielectric layer 110 may include the following. A patterned mask is disposed on the first dielectric layer 110, and then etching (for example, wet etching or dry etching) is performed on the first dielectric layer 110. The first dielectric layer 110 after patterning may have a plurality of first openings O1, and the plurality of first openings O1 may expose the conductive structure 111, for example. In other words, in the normal direction of the carrier 300, the first openings O1 may overlap the conductive structure 111.

In some embodiments, the first dielectric layer 110 may have a thickness T1, and the thickness T1 may be defined as the maximum thickness of the first dielectric layer 110 in the normal direction of the carrier 300 in a cross-section. In some embodiments, the thickness T1 of the first dielectric layer 110 is, for example, between 5 μm and 25 μm (5 μm≤thickness T1≤25 μm) or between 10 μm and 20 μm (10 μm≤thickness T1≤20 μm), but is not limited thereto.

In some embodiments, the material of the first dielectric layer 110 may include an organic insulation layer or an inorganic insulation layer, and the material thereof may include a photosensitive polyimide material, an organic polymer material, a photoresist material, or other suitable materials. In some embodiment, the first dielectric layer 110 may include polyimide (PI), polyamide, polybenzoxazole (PBO), acrylic, siloxane, ajinomoto build-up layer (ABF), cyclo olefin polymer, other suitable materials, or a combination of the above materials, but is not limited thereto.

In some embodiments, the coefficient of thermal expansion of the first dielectric layer 110 is between 3 ppm/° C. and 80 ppm/° C. (3 ppm/° C.≤coefficient of thermal expansion≤80 ppm/° C.), between 10 ppm/° C. to 70 ppm/° C. (10 ppm/° C.≤coefficient of thermal expansion≤70 ppm/° C.) or between 15 ppm/° C. to 65 ppm/° C. (15 ppm/° C.≤coefficient of thermal expansion≤65 ppm/° C.), but is not limited thereto.

Figure 2C:
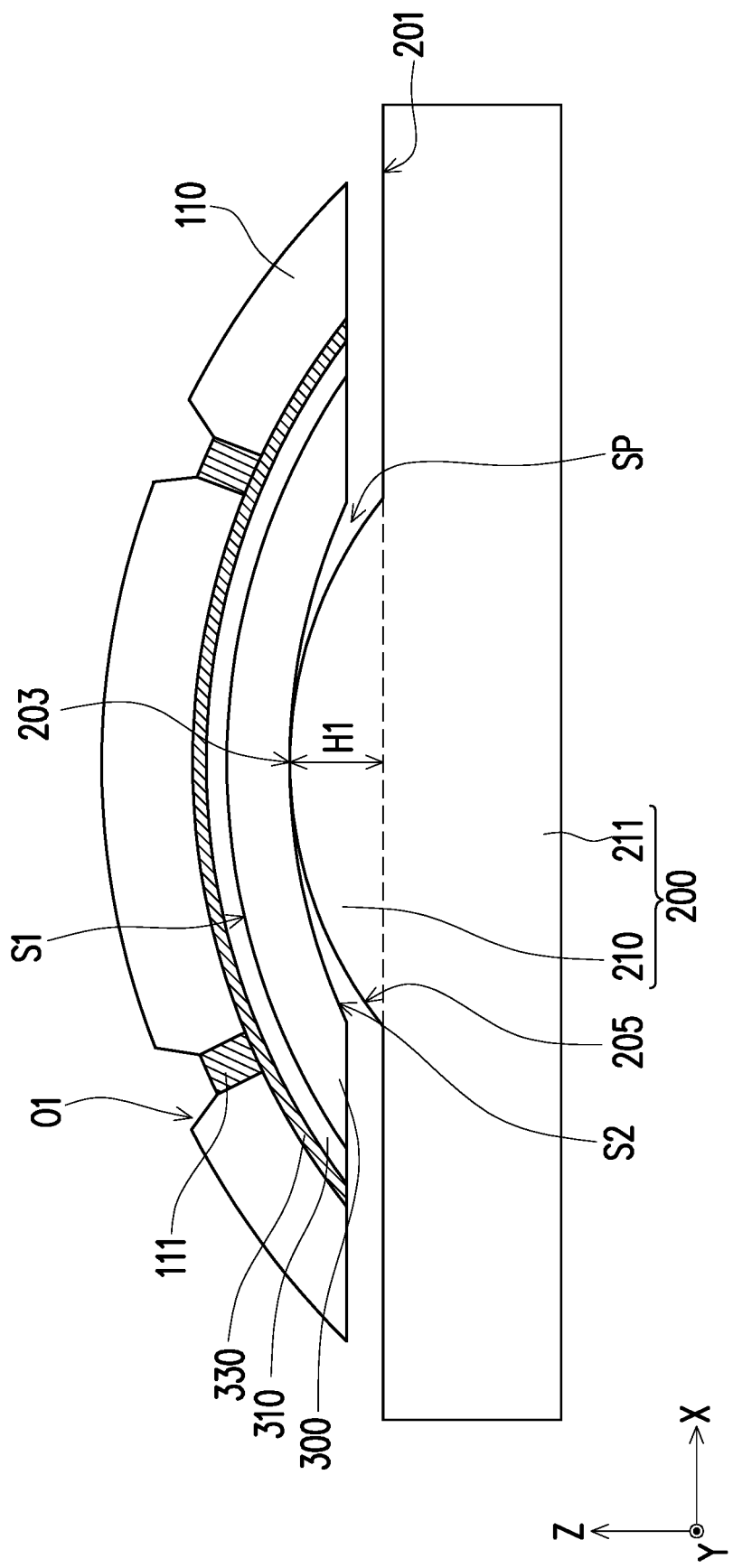

Referring to FIGS. 1 and 2C, next, in step S140, the carrier 300 on which the first dielectric layer 110 is formed is disposed on the first curved-surface mold 200, and the first dielectric layer 110 is cured. The first curved-surface mold 200 has the projection 210, and the projection 210 has the thickness H1. In some embodiments, the coefficient of thermal expansion of the first curved-surface mold 200 may be similar to, but not limited to, the coefficient of thermal expansion of the carrier 300, for example. In some embodiments, the coefficient of thermal expansion of the first curved-surface mold 200 may be less than or equal to 10 ppm/° C. or less than or equal to 8 ppm/° C., but is not limited thereto. In some embodiments, the hardness of the first curved-surface mold 200 may be, for example, less than the hardness of the carrier 300 to reduce the risk of the carrier 300 being scratched, but the disclosure is not limited thereto.

In some embodiments, the first curved-surface mold 200 may have a bottom plate 211 and the projection 210, and the projection 210 is connected to the bottom plate 211. In some embodiments, the material of the bottom plate 211 and the material of the projection 210 may be the same or different. In some embodiments, the bottom plate 211 and the projection 210 may be integrally formed, for example.

In some embodiments, a surface 201 of the bottom plate 211 may be connected to a curved surface 205 of the projection 210, for example. The curved surface 205 may be in contact with the carrier 300. In some embodiments, the curved surface 205 has a vertex 203 at the highest height of the curved surface 205. In some embodiments, the projection 210 of the first curved-surface mold 200 has the thickness H1, and the thickness H1 may be defined as the distance between the vertex 203 and the upper surface 201 in the normal direction (such as the direction of the Z axis in the figure) of the bottom plate 211. The range of the thickness H1 of the projection 210 of the first curved-surface mold 200 is between 0.1 mm and 0.4 mm (0.1 mm≤thickness H1≤0.4 mm) or between 0.15 mm and 0.35 mm (0.15 mm≤thickness H1≤0.35 mm), but is not limited thereto.

In some embodiments, the carrier 300 on which the first dielectric layer 110 is formed may be disposed on the first curved-surface mold 200, and the carrier 300 may be adjacent to or in contact with the projection 210 of the first curved-surface mold 200. In some embodiments, the projection 210 of the first curved-surface mold 200 has a plurality of holes (not shown), for example. In some embodiments, in the step of curing the first dielectric layer 110, a vacuum tool (not shown) may vacuum the carrier 300 through these holes, so that the carrier 300 is adsorbed on the curved surface 205 of the projection 210. In this way, a bending force is formed on the carrier 300. As mentioned above, the first curved-surface mold 200 may, for example, generate a bending force opposite to the warpage direction to the carrier 300, so that the carrier 300 may roughly bend along with the projection 120 of the first curved-surface mold 200, thereby reducing warpage of the composite layer circuit element 100. Through the method of manufacturing the composite layer circuit element 100 of the disclosure, the composite layer circuit element 100 may have good structural resistance or quality.

In some embodiments, in the step of curing the first dielectric layer 110, part of the carrier 300 may, for example, be in contact with the first curved-surface mold 200 (for example, the projection 210), and another part of the carrier 300 may not be in contact with the first curved-surface mold 200, so that there may be a gap SP between the carrier 300 and the projection 210 of the first curved-surface mold 200. In some embodiments, the plurality of holes (not shown) may, for example, be distributed only in part of the projection 210, for example, the holes may only be distributed in the center portion of part of the projection 210, so that said another part of the carrier 300 cannot be absorbed on the projection 210, and there may be the gap SP between the carrier 300 and the projection 210 of the first curved-surface mold 200, but the disclosure is not limited thereto. Through the above design, in the step of curing the first dielectric layer 110, the bending force caused by the first curved-surface mold 200 being completely absorbed on the projection 210 of the first curved-surface mold 200 may be reduced, and the risk of breakage of the carrier 300 may be reduced, but the disclosure is not limited thereto.

In some embodiments, the above-mentioned step of curing the first dielectric layer 110 includes a baking process of the first dielectric layer 110. The baking process includes putting the first dielectric layer 110 in an environment with an oxygen concentration of less than 100 ppm and heating the first dielectric layer 110 for about 3 hours. The temperature of baking is, for example, between 180° C. and 350° C. (180° C.≤temperature≤350° C.), but is not limited thereto. In some embodiments, the first dielectric layer 110 may be baked, for example, in an oven under a vacuum environment. In other embodiments, the first dielectric layer 110 may be baked in an oven under a nitrogen (N2) environment, but the disclosure is not limited thereto.

Figure 2D:
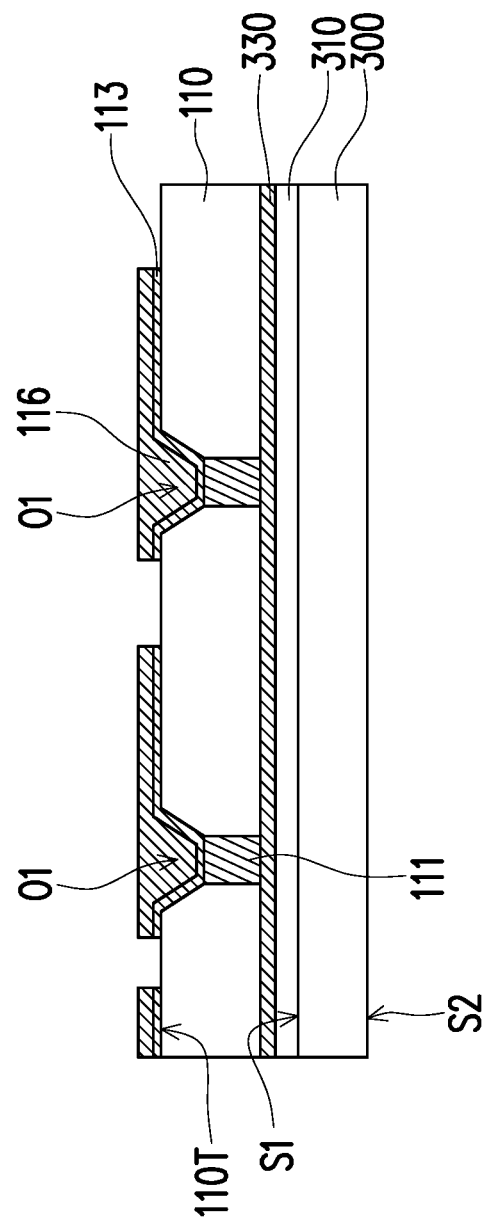

Referring to FIGS. 1 and 2D, similarly, next, a second seed layer 113 is formed on an upper surface 110T of the first dielectric layer 110. Part of the second seed layer 113 may be filled into the opening O1 of the first dielectric layer 110, for example. The material or formation method of the second seed layer 113 may be similar to that of the first seed layer 330. Next, a conductive material layer is disposed on the second seed layer 113, and then a patterned photoresist is formed on the conductive material layer to form a mask. Etching is performed on the conductive material and the second seed layer 113 exposed by the mask to pattern the conductive material layer and the second seed layer 113, and a plurality of conductive structures 116 are formed on the patterned conductive material layer.

Figure 2E:
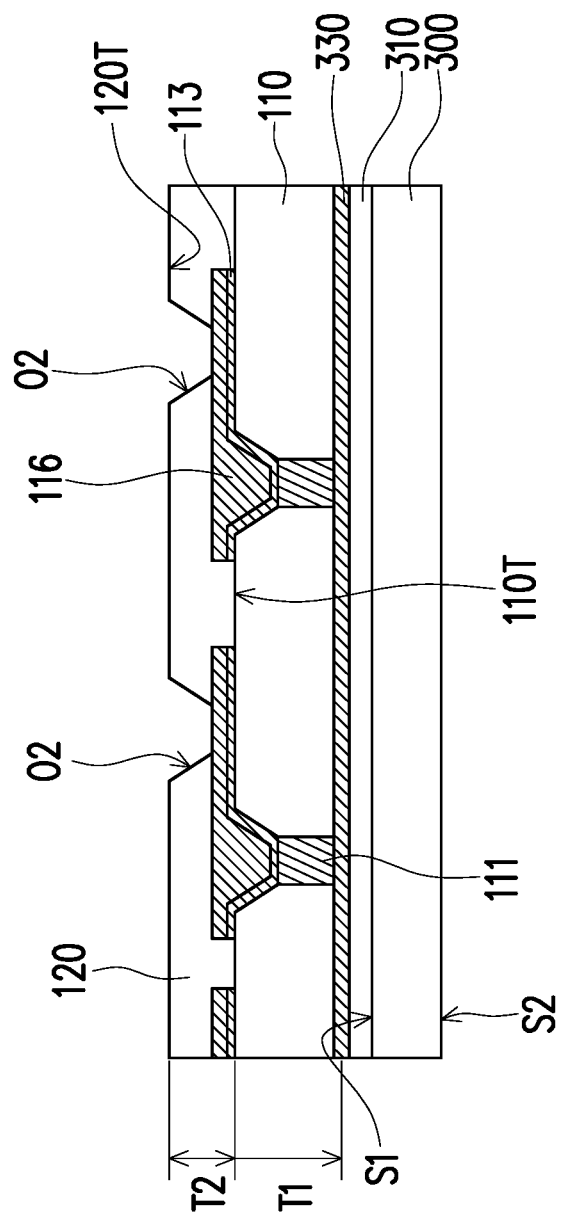

Referring to FIGS. 1 and 2E, next, in step S150, the second dielectric layer 120 is formed on the first dielectric layer 110. Specifically, a first circuit layer (including the aforementioned conductive structure 116) is disposed on the first dielectric layer 110, and a second dielectric layer 120 is disposed on the first circuit layer (including the aforementioned conductive structure 116). In other words, the second dielectric layer 120 may be disposed on the upper surface 110T of the first dielectric layer 110 and the conductive structure 116, for example. In some embodiments, the second dielectric layer 120 has a thickness T2. The thickness T2 may be defined as the maximum thickness of the second dielectric layer 120 in the normal direction of the carrier 300 in a cross-section. In some embodiments, the thickness T2 of the second dielectric layer 120 is, for example, between 5

μm to 25 μm (5 μm≤thickness T2≤25 μm) or 8 μm to 20 μm (8 μm≤thickness T2≤20 μm), but is not limited thereto.

In some embodiments, the thickness T1 of the first dielectric layer 110 may be greater than the thickness T2 of the second dielectric layer 120. In some embodiments, the thickness ratio of the thickness T1 of the first dielectric layer 110 to the thickness T2 of the second dielectric layer 120 may be between 1.5 and 10 (1.5≤T1/T2≤10) or between 2 and 5 (2≤T1/T2≤5), but is not limited thereto. Since the more stacked dielectric layers of the composite layer circuit element 100, the greater the degree of warpage may be, by designing the thickness of the N-th dielectric layer to be thinner than the thickness of the M-th dielectric layer, in which M is less than N, warpage may be reduced. For example, the thickness T2 of the second dielectric layer 120 disposed on the first dielectric layer 110 may be smaller than the thickness T1 of the first dielectric layer 110, which may reduce the degree of warpage of the stacked composite layer circuit element 100.

In some embodiments, the material of the second dielectric layer 120 and the material of the first dielectric layer 110 are, for example, the same or different. The material of the first dielectric layer 110 mentioned above may be referred to for the material of the second dielectric layer 120, so details thereof will not be repeated herein. In some embodiments, the coefficient of thermal expansion of the second dielectric layer 120 is between 3 ppm/° C. and 80 ppm/° C. (3 ppm/° C.≤coefficient of thermal expansion≤80 ppm/° C.), between 10 ppm and 70 ppm (10 ppm/° C.≤coefficient of thermal expansion≤70 ppm/° C.) or between 15 ppm and 65 ppm (15 ppm/° C.≤coefficient of thermal expansion≤65 ppm/° C.), but is not limited thereto.

Next, referring to FIGS. 1 and 2E, in step S160, the second dielectric layer 120 is patterned. The method of patterning the second dielectric layer 120 may be similar to the method of patterning the first dielectric layer 100, so the method will not be repeated herein. The second dielectric layer 120 after patterning may have a plurality of second openings O2, and the plurality of second openings O2 may, for example, expose part of the conductive structure 116.

Figure 2F:
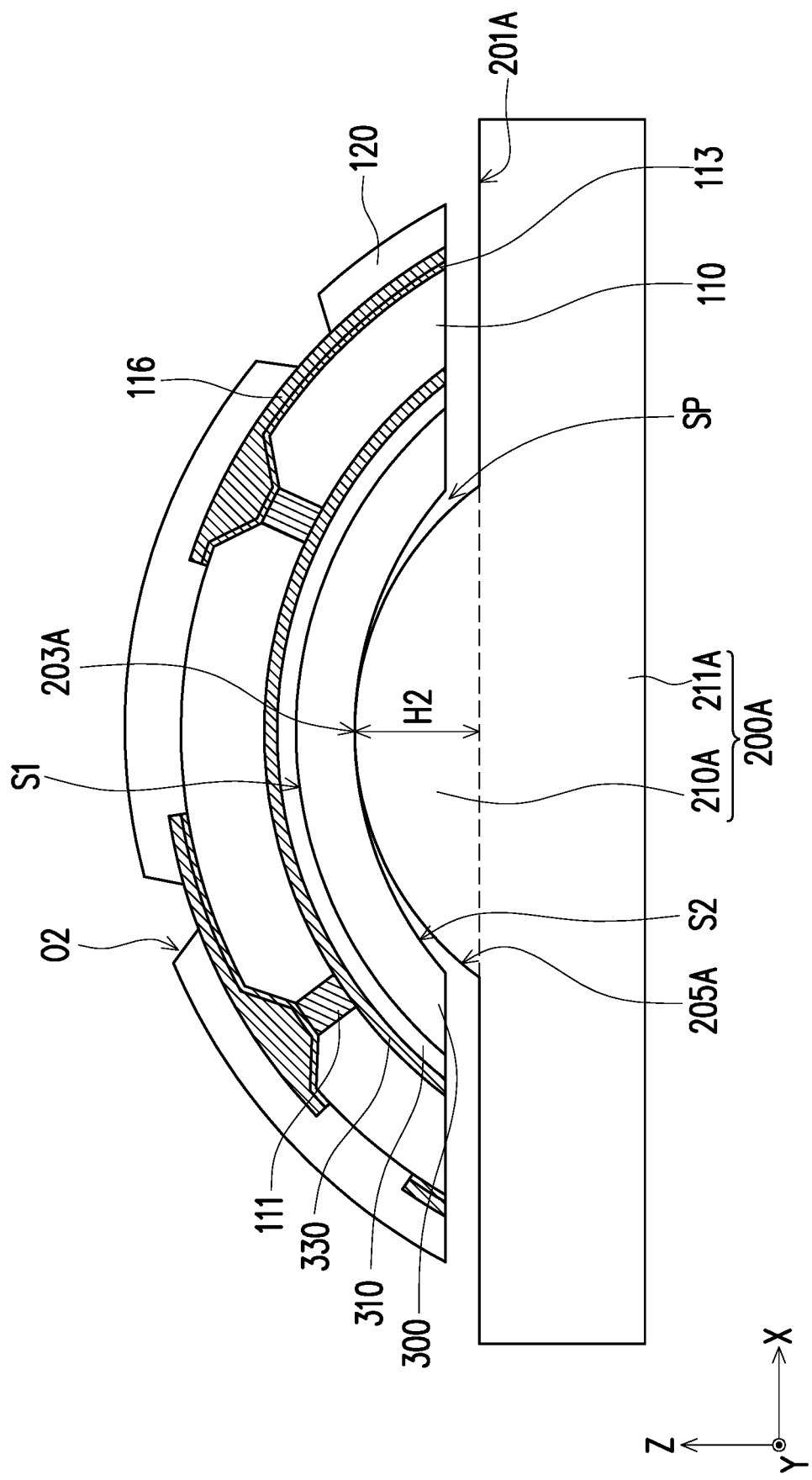

Referring to FIGS. 1 and 2F, next, in step S170, the carrier 300 on which the first dielectric layer 110 and the second dielectric layer 120 are formed is disposed on the second curved-surface mold 200A, and the second dielectric layer 120 is cured. The second curved-surface mold 200A has the projection 210A, and the projection 210A has the thickness H2. In some embodiments, the material of the second curved-surface mold 200A is similar to the material of the first curved-surface mold 200, and the first curved-surface mold 200 may be referred to for the coefficient of thermal expansion or hardness characteristic of the second curved-surface mold 200A.

It should be noted that the difference between the second curved-surface mold 200A and the first curved-surface mold 200 is that the thickness H1 of the projection of the first curved-surface mold 200 may be smaller than the thickness H2 of the projection of the second curved-surface mold 200A, for example. Specifically, the second curved-surface mold 200A has a bottom plate 211A and the projection 210A, and the projection 210A is connected to the bottom plate 211A. In some embodiments, the material of the bottom plate 211A and the material of the projection 210A may be the same or different. In some embodiments, the bottom plate 211A and the projection 210A may be integrally formed, for example. In some embodiments, a surface 201A of the bottom plate 211A may be connected to a curved surface 205A of the projection 210A, and the curved surface 205A may be in contact with the carrier 300. In some embodiments, the surface 205A has a vertex 203A at the highest height of the surface 205A. The projection 210A of the second curved-surface mold 200A has the thickness H2, and the thickness H2 may be defined as the distance between the vertex 203A and the upper surface 201A in the normal direction (for example, the Z-axis direction in the figure) of the bottom plate 211A. The thickness H2 of the projection 210A of the second curved-surface mold 200A is between 0.3 mm and 0.8 mm (0.3 mm≤thickness H2≤0.8 mm), but is not limited thereto.

In some embodiments, the ratio of the thickness H1 of the projection 210 of the first curved-surface mold 200 to the thickness H2 of the projection 210A of the second curved-surface mold 200A may be between 1 and 5 (1<thickness H1/thickness H2≤5)_ or between 1 and 3 (1<thickness H1/thickness H2≤3)_ or between 1 and 2 (1<thickness H1/thickness H2≤2), but is not limited thereto.

In some embodiments, the coefficient of thermal expansion of the second curved-surface mold 200A may be less than or equal to 10 ppm/° C. or less than or equal to 8 ppm/° C., but is not limited thereto. In some embodiments, the hardness of the second curved-surface mold 200A may be, for example, less than the hardness of the carrier 300 to reduce the risk of the carrier 300 being scratched, but the disclosure is not limited thereto.

In some embodiments, the carrier 300 on which the first dielectric layer 110 and the second dielectric layer 120 are formed may, for example, be disposed on the second curved-surface mold 200A, and the carrier 300 may be adjacent to or in contact with the projection 210A of the second curved-surface mold 200A. In some embodiments, the projection 210A of the second curved-surface mold 200A has, for example, a plurality of holes (not shown). In some embodiments, in the step of curing the second dielectric layer 120, a vacuum tool (not shown) may vacuum the carrier 300 through the holes, so that the carrier 300 is absorbed on the curved surface 205A of the projection 210A. In this way, the bending force as described above is formed. As mentioned above, the second curved-surface mold 200A may, for example, generate a bending force opposite to the warpage direction to the carrier 300, so that the carrier 300 may roughly bend along with the projection 120A of the second curved-surface mold bending 200A, thereby reducing warpage of the composite layer circuit element 100. Through the method of manufacturing the composite layer circuit element 100 of the disclosure, the composite layer circuit element 100 may have good structural resistance or quality.

In some embodiments, in the step of curing the second dielectric layer 120, part of the carrier 300 may, for example, be in contact with the second curved-surface mold 200A (for example, the projection 210A), and another part of the carrier 300 may not be in contact with the second curved-surface mold 200A, so that there may be the gap SP between the carrier 300 and the projection 210A of the second curved-surface mold 200A. In some embodiments, the plurality of holes (not shown) may, for example, be distributed only in part of the projection 210A. The holes (not shown), for example, may only be distributed in the center portion of part of the projection 210A, so that part of the carrier 300 cannot be absorbed on the projection 210A, and there may be the gap SP between the carrier 300 and the projection 210A of the second curved-surface mold 200, but the disclosure is not limited thereto. Through the above design, in the step of curing the second dielectric layer 120, the bending force caused by the first curved-surface mold 200A being completely absorbed on the projection 210A of the first curved-surface mold 200A may be reduced, and the risk of breakage of the carrier 300 may be reduced, but the disclosure is not limited thereto.

In some embodiments, the above-mentioned step of curing the second dielectric layer 120 includes a baking process of the second dielectric layer 120, and the conditions of the baking process may be similar to the conditions of the baking process of curing the first dielectric layer 110.

Figure 2G:
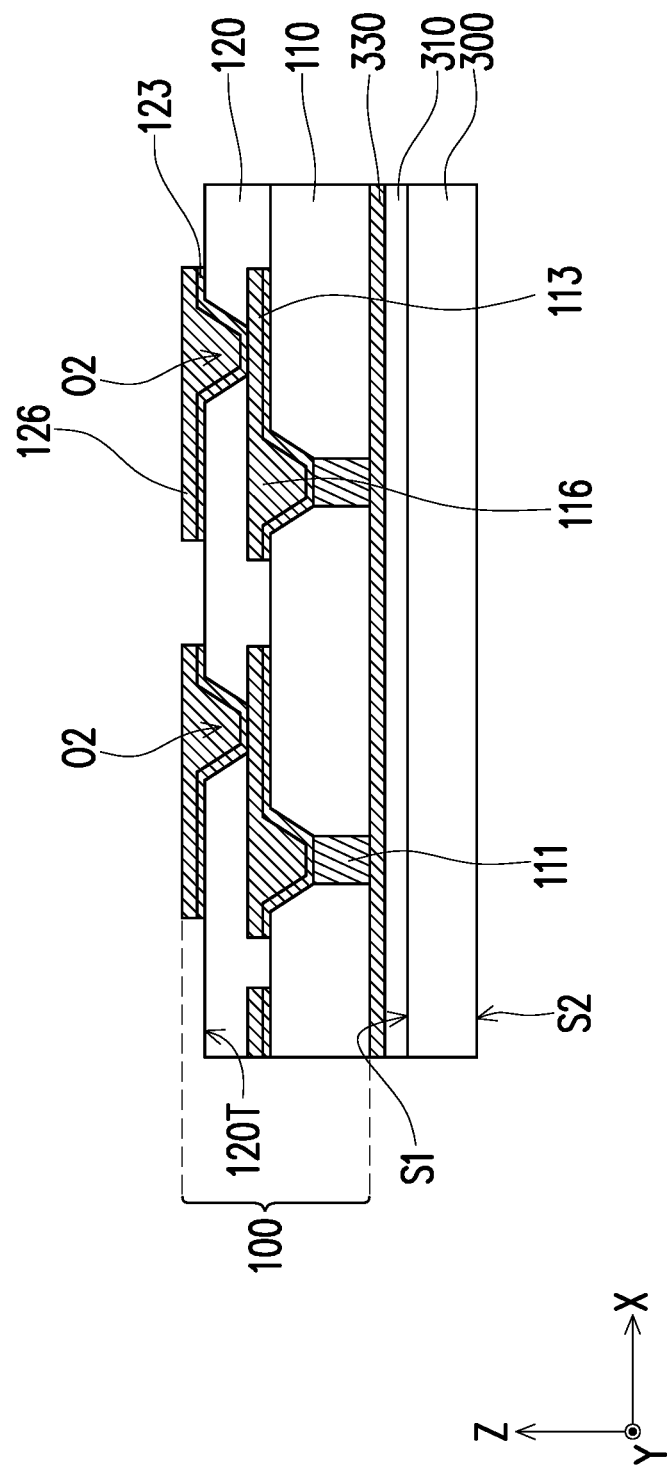

Referring to FIG. 2G, next, a third seed layer 123 is formed on an upper surface 120T of the second dielectric layer 120. The third seed layer 123 may be filled into the opening O2 of the second dielectric layer 120, for example. Next, a conductive material layer is disposed on the third seed layer 123, and then the conductive material layer and the third seed layer 123 are patterned so that a plurality of conductive structures 126 are formed on the patterned conductive material layer. The method of forming the plurality of conductive structures 111 as described above may be referred to for the method of patterning the conductive material layer to form the conductive structures 126 as described above. So far, the manufacturing of the composite layer circuit element 100 is roughly completed. It should be noted that the composite layer circuit element 100 of the disclosure is, for example, shown in a lamination form of FIG. 2G, but the disclosure is not limited thereto. In other embodiments, the lamination of the composite layer circuit element 100, such as the number or the connection method of the seed layers, conductive structures, and/or dielectric layers may be adjusted according to requirements. It should be noted that the manufacturing method of the composite layer circuit element 100 of the disclosure only indicates that the first curved-surface mold 200 and the second curved-surface mold 200A are used, for example, but the disclosure is not limited thereto. In other embodiments, the number of curved-surface molds used in the manufacturing method of the composite layer circuit element 100 may be adjusted, for example, according to the number of dielectric layers required to be cured.

Figure 2H:
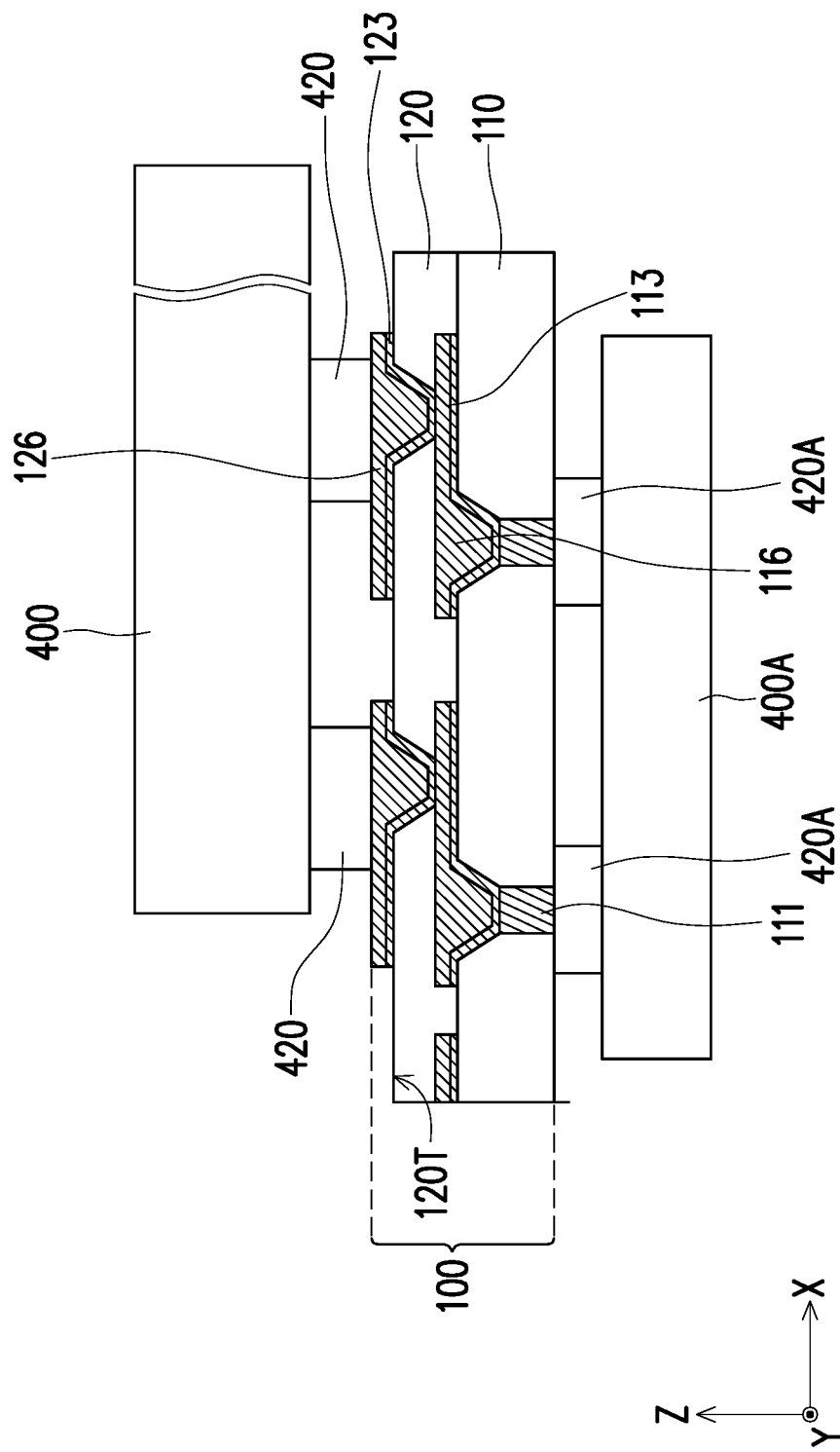
FIG. 2H is a schematic cross-sectional view of an electronic device that includes a composite layer circuit element according to an embodiment of the disclosure.

FIG. 2H is a schematic cross-sectional view of an electronic device that includes a composite layer circuit element according to an embodiment of the disclosure. For the clarity of the drawings and the convenience of description, several elements are omitted in FIG. 2H. Referring to FIG. 2H, the carrier 300, the release layer 310, and the first seed layer 330 are removed. For example, the carrier 300, the release layer 310, and/or the first seed layer 330 may be removed by laser or other suitable methods, but the disclosure is not limited thereto. In addition, by designing the thickness T1 of the first dielectric layer 110 to be greater than the thickness T2 of the second dielectric layer 120 in the disclosure, the impact on the composite layer circuit element when the carrier 300, the release layer 310, and/or the first seed layer 330 are removed may be reduced. Specifically, in the process of removing the carrier 300, the release layer 310 and/or the first seed layer 330, part of the first dielectric layer 110 may be slightly removed or damaged. By designing the thickness T1 of the first dielectric layer 110 to be greater, the yield of the composite layer circuit element may be less affected by the thickness T1 of the first dielectric layer 110 being reduced.

Next, an external electronic element may be selectively bonded to the composite layer circuit element 100 to form an electronic device 10. For example, the external electronic element may include a first electronic element 400 or a second electronic element 400A. The first electronic element 400 and the second electronic element 400A may include, for example, an integrated circuit chip (IC chip), a light emitting diode (LED), or other suitable electronic elements or circuit elements, but is not limited thereto. In some embodiments, the step of disposing the external electronic element may be performed before the step of removing the carrier 300. The embodiment of the disclosure is not limited thereto.

In some embodiments, the first electronic element 400 may be, for example, a light emitting diode, but is not limited thereto. The first electronic element 400 may be electrically connected to the composite layer circuit element 100 through a conductive bump 420. The second electronic element 400A may be an integrated circuit chip, but the disclosure is not limited thereto. In some embodiments, the second electronic element 400A may be electrically connected to the composite layer circuit element 100 through a conductive bump 420A. In this way, the composite layer circuit element 100 may be applied to a light-emitting display device or other suitable electronic devices. The electronic device 10 including the composite layer circuit element 100 may have good structural resistance or quality.

In some embodiments, the manufacturing method of the composite layer circuit element of the disclosure can be applied to, for example, manufacturing semiconductor packaged type electronic device, such as system on chip (SoC), system in package (SiP) or other electronic devices manufactured by the method mentioned above. Specifically, the manufacturing method of the composite layer circuit element of the disclosure can be applied to a redistribution layer first type process (RDL first), a chip first/face up type process (chip first/face up) or a chip first/face down type process (chip first/face down). In the redistribution layer first type process, the carrier 300 may include glass, quartz, sapphire, ceramic, stainless steel, silicon wafer, molding compound (such as resin, epoxy resin, organic silicon compound), other suitable substrate materials, or a combination of the aforementioned, but is not limited thereto. In the chip first/face up type process and the chip first/face down type process, the carrier 300 may include an integrated circuit chip encapsulated with an molding compound (such as resin, epoxy resin, organic silicon compound), silicon wafer, glass, other suitable substrate materials, or a combination of the aforementioned, but is not limited thereto. In some embodiments, in the redistribution layer first type process, the carrier 300 may be removed after a redistribution layer is manufactured, so that the redistribution layer may be bound with components such as integrated circuit chips and/or printed circuit boards in subsequent processes. In some embodiments, in the chip first/face up type process and the chip first/face down type process, a release layer may be selectively provided on the carrier 300 or need not be provided.

In summary, in the composite layer circuit element of the embodiment of the disclosure, since the curved-surface mold is provided in the step of curing the dielectric layer, the carrier may be bent towards the direction of the curved-surface mold during the dielectric layer being cured to offset the warping force during curing. Accordingly, warpage of the dielectric layer and the carrier after curing may be reduced to provide the composite layer circuit unit with a good structural resistance or quality. In addition, the overall degree of warpage of the composite layer circuit unit may be reduced by adjusting the thickness of the dielectric layer of the composite layer circuit unit.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recorded in the embodiments, or to equivalently replace some or all of the technical features; the modifications or replacements do not cause the essence of the corresponding technical solutions to deviate from the scope of the technical solutions of the embodiments.

What is claimed is:

1. An electronic device including a composite layer circuit element, comprising:
   a first dielectric layer;
   a first conductive structure, penetrating a portion of the first dielectric layer;
   a first circuit layer, disposed on the first dielectric layer;
   a second dielectric layer, disposed on the first circuit layer; and
   a second conductive structure, disposed on the second dielectric layer and electrically connected to the first conductive structure through the first circuit layer,
   wherein the second conductive structure contacts the first circuit layer, and the second conductive structure does not contact the first conductive structure,
   wherein a thickness of the first dielectric layer is greater than a thickness of the second dielectric layer in a cross section view, and a ratio of the thickness of the first dielectric layer to the thickness of the second dielectric layer is between 1.5 and 5,
   wherein the thickness of the first dielectric layer is between 5 micrometers and 25 micrometers, and the thickness of the second dielectric layer is between 5 micrometers and 25 micrometers,
   wherein a coefficient of thermal expansion of the first dielectric layer and the second dielectric layer is between 15 ppm/° C. and 65 ppm/° C.

* * * * *